United States Patent

Wegmann et al.

Patent Number: 5,038,044
Date of Patent: Aug. 6, 1991

[54] METHOD AND DEVICE FOR THE DEFLECTION OF A BEAM

[75] Inventors: Urs Wegmann, Oberschan; Albert Koller, Sargans, both of Switzerland

[73] Assignee: Balzers Aktein gesellschaft, Balzers, Liechtenstein

[21] Appl. No.: 577,467

[22] Filed: Sep. 4, 1990

[30] Foreign Application Priority Data

Sep. 5, 1989 [DE] Fed. Rep. of Germany ....... 3929475

[51] Int. Cl.⁵ .......................... B23K 15/00; H01J 3/28
[52] U.S. Cl. .......................... 250/396 ML; 250/346 R; 250/398; 250/492.3
[58] Field of Search ........... 250/396 ML, 396 R, 398, 250/492.3; 273/13; 219/121.16; 328/228; 335/210

[56] References Cited

U.S. PATENT DOCUMENTS

| 3,420,977 | 1/1969 | Hanks et al. | 219/121.16 |
| 4,064,352 | 12/1977 | Mann | 373/13 |
| 4,464,573 | 8/1984 | Dalgolish | 250/396 R |
| 4,804,852 | 2/1989 | Rose et al. | 250/398 |

Primary Examiner—Jack I. Berman
Assistant Examiner—Kiet T. Nguyen
Attorney, Agent, or Firm—Natario & Michalos

[57] ABSTRACT

In order to utilize a magnet arrangement having a magnetic flux density field for beam guidance in the deflection of a beam of monopolar charged particles, regions of the field having curved field lines, are modified to significantly linearize the field lines in the area of the beam. An additional flux density field is superimposed on the primary flux density field so that the field lines interact in an harmonic synthesis and so that the field lines of the resulting field in the region of interest, extend linearly. In this way, the deflection force on the beam is essentially independent of the beam position in the field direction and in the linearized region.

20 Claims, 6 Drawing Sheets

METHOD AND DEVICE FOR THE DEFLECTION OF A BEAM

FIELD AND BACKGROUND OF THE INVENTION

The present invention relates to a method for the deflection or bending of a beam of monopolar charged particles, in particular of electrons in which in a first direction perpendicularly to the direction of propagation of the beam flux density field is applied in order to deflect beam into a second direction perpendicular to the first and to the direction of beam propagation.

Such a method is known from U.S. Pat. No. 4,064,352. In that patent an electron beam from an electron beam gun used for the vaporization of a target material, is deflected by more than 180° by disposing on both sides of the beam path, pole shoes of a magnetic pole arrangement between which a deflection field is generated. The electron beam therein extends by sections above the front faces of the pole shoes and consequently is located within a with curved lines of force of said field.

Figure 1:
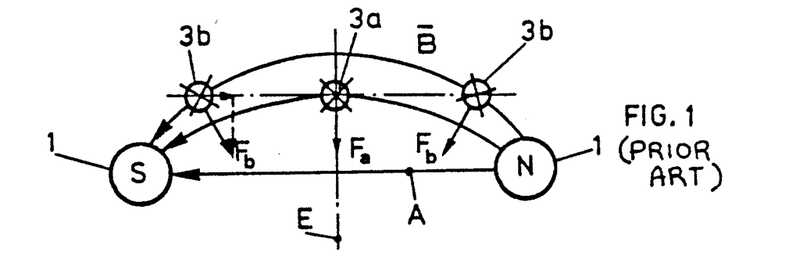
FIG. 1 is a schematic illustration of a magnetic field generated between pole shoes of a magnet, and with an electron beam which is meant to be deflected by the field, at various positions in the field.

Such a deflection method is disadvantageous as will be explained in conjunction with FIG. 1. In FIG. 1 two magnetic poles 1 forming a magnetic dipole are represented schematically. The result is the flux density field $\bar{B}$ represented qualitatively which extends in the region of the dipole axis A as a straight line between the magnetic poles 1. If according to the cited U.S. Pat. No. 4,064,352 a beam of charged particles such as electron beam 3 is guided essentially in the plane of symmetry E perpendicularly to the dipole axis A between the magnetic poles 1, the charged particles experience a deflection force F as drawn in FIG. 1. This deflection force is employed to deflect the electron beam according to the cited U.S. Patent. If the position of the beam of charged particles is offset with respect to the plane of symmetry E as shown at 3b, deflection forces $F_b$ result which, in contrast to the force $F_a$ relative to the dipole axis A, have a transverse and a longitudinal component whereas in the case of the beam 3a located in the plane of symmetry E only a transverse component to axis A is generated.

It is evident that a coupling exists between the position of the beam in the direction of the dipole axis A and the deflection transversely to this axis A. Furthermore at a given flux density field and on shifting of the position of the beam in the direction of the dipole axis A, as shown in dot-dash lines, the beam cross sections are also influenced; different forces act at different regions of the cross-sectional area of the beam.

A further disadvantage can be seen in that on position change of the beam parallel to the axis A the absolute magnitudes of the resulting forces F change because the beam is not shifted along the lines of force of the field where the magnitude of the field vectors would be constant.

Figure 2:
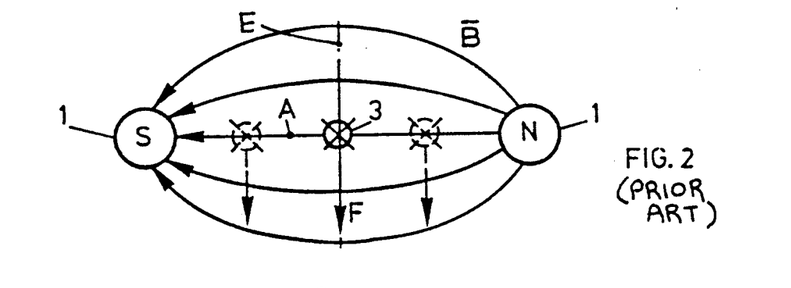
FIG. 2 is a schematic illustration similar to FIG. 1, showing a different arrangement for deflecting the electron beam.

U.S. Pat. No. 3,420,977 discloses a method which either does not have the stated disadvantages or has them to a lesser extent. Here, a deflection flux density field is generated by magnetic pole shoes and the beam of charged particles, again electrons, is guided between the pole shoes. The extended pole shoes generate a field with only slightly curved lines of force. Consequently the electron beam 3 as shown in FIG. 2, is rather shifted along the dipole axis A. In the ideal case, always constant transverse forces relative to axis A, result.

This arrangement, in turn, has however the disadvantage that precisely when deflecting a beam by a large angle such as by 180° and /more, for example by 270°, the magnetic arrangement becomes voluminous because the pole shoes must accept the beam between them along long regions. The pole shoes are also subjected to the effect of the beam on a target object, in particular the vaporization of materials to an increased degree. Moreover, the extent to which the beam can be shifted transversely to the shoes on the target object such as the crucible to be vaporized, is a function of the distance and the length of the shoes.

The disadvantages of the known approaches thus fundamentally rest with the fact therein that the regions of the deflection flux density field having curved lines of force and being thus inhomogeneous field regions, are not suitable for beam guidance as explained in conjunction with FIG. 1.

SUMMARY OF THE INVENTION

The present invention builds on the task of utilizing inhomogeneous curved deflection field regions for beam guidance but without stated disadvantage. The flexibility with respect to the structural shape of elements for generating the deflection field, such as of pole shoes, is significantly by the invention.

Accordingly an object of the present invention is to provide a method of deflecting a monopolar beam, such as an electron beam, comprising/generating a first magnetic flux density field between a magnetic dipole having curved lines of force, generating at least one additional flux density field for essentially linearizing the field lines of the first magnetic flux density field in a path region for the beam, and passing the beam through the path region.

A further object of the present invention is to provide such a method wherein the second flux density field comprises a compensation field which is superimposed on the first field, the center of curvature of the lines of force of the compensation field being lateral to the path region and in the vectors of the compensation field having substantially the same direction as the vectors along the curved lines of force of the first field.

When using the method according to the invention with an electron beam, such as the beam of an electron gun for vaporizing material in a coating facility, the beam is controllably deflected in a first direction too, i.e. laterally and essentially in the direction of the deflection field. This further lateral deflection within the longitudinal deflection field region is linearized according to the invention and barely causes a change in longitudinal beam diversion. On the other hand the longitudinal deflection can be changed without the lateral deflection being changed in the process. Further since the beam can be guided in initially inhomogeneous field regions, which only through the invention are homogenized, in particular outside of a pole shoe arrangement, the lateral deflection shift can be significantly increased without the beam in the process approaching the pole shoes too much.

The lateral deflection is also preferably carried out by means of a controllable lateral deflection flux density field which essentially is generated in a second direction to the beam propagation direction i.e. essentially in the longitudinal deflection direction.

Additionally it is suggested, according to the invention that especially when applying the method according to the invention with the stated electron gun, to controllably change the beam with respect to its cross-sectional area, in an essentially decoupled manner from the longitudinal deflection and if need be from the lateral deflection. In the latter case three control variables which are largely decoupled from each other, are given for the beam so that the position of its impingement area on a target is variable in two coordinates and additionally the size of this impingement area and consequently the energy density produced is variable.

The beam with respect to its cross-sectional area is also preferably controlled by means of a focussing flux density field which essentially is likewise applied in deflection of longitudinal deflection with opposite poles on both sides of the beam and/or likewise in a lateral deflection direction. By the opposite polarity of field on both sides of the beam at a particular beam cross-sectional area, "tensile" or "pressure forces" compress or expand the beam cross-sectional area.

As is further evident in U.S. Pat. No. 4,064,352, a pair of extended magnetic pole arrangements are there provided on both sides of the beam in the beam of pole shoes for the generation of the longitudinal deflection flux density field. These poles shoes extend over the entire region traversed by the electron beam between beam generator and target. Consequently the beam travels essentially through constant longitudinal deflection field conditions.

In the above stated sense it is beyond others a goal of the present invention to provide pole arrangements for the longitudinal deflection of the beam which are as small as possible and which also permit influencing the beam path outside of the region of the magnetic poles.

The invention also builds on the known method for the formation of the beam path of a beam of monopolar charged particles, in particular electrons, in which a magnetic flux density field is generated in a first direction perpendicular to the direction of beam propagation in order to deflect the beam into a second direction perpendicular to the first and to the direction of beam propagation. The field for the beam is generated through expanded pole arrangements essentially provided on both sides of a deflection plane, wherein the beam is guided through a region of curved lines of force of the deflection field between the pole arrangements such as, for example, in U.S. Pat. No. 4,064,352. This task is achieved according to an additional aspect of the invention by providing edge faces of the pole arrangements which essentially shape the curved field, in order to expose the beam along its path to differently directed deflection forces and to guide the beam into a given path.

Through such specific formation of the edge faces of the pole arrangements, longitudinal deflection forces can be applied on the beam along its propagation directed in a desired way and consequently the path can be shaped to have changing curvature in the direction of propagation, even outside the pole shoes.

Accordingly, the invention allows for longitudinal deflection of the beam towards the target direction with decreasing curvature by making the envelope of the magnetic arrangement inclined in the direction towards the target. In this way, the provided pole arrangements, viewed in the direction towards the target, can be made significantly shorter and the beam, after leaving the region between the poles, can be directed in a path with decreasing curvature onto the target area which is outside the pole arrangement in such a way that the pole arrangement is protected from the effects of the beam on the target area. Further relatively large target areas can be used since the impingement area of the beam on the target can be displaced more than the pole shoe distance would otherwise allow.

Another object of the present invention is to provide a method for the formation of a beam path of a beam of monopolar charge particles, in particular electrons, by generating a magnetic deflection flux density field in a first direction which is perpendicular to the direction of beam propagation, and in a second direction perpendicular to the first direction, the magnetic flux density field being generated between pole shoes, having faces which are parallel to the deflection plane in order to expose the beam to differently directed deflection forces along the path and to guide the beam in a given path with varying curvature. The faces of the pole shoes are also advantageously inclined at least in sections in order to decrease the deflection curvature of the beam in a target direction for the beam towards a target. These features can be combined with the above described features, which permit a disadvantage-free utilization of inhomogeneous deflection field regions.

Building on a device for the deflection of a beam of monopolar charged particles, in particular of electrons, in which a region for the beam path is provided as well as a magnetic deflection pole arrangement which generates, from pole to pole, a curved deflection flux density field in the region for the beam path in a direction essentially perpendicular to the beam and for realizing the initially stated task, the invention also provides for an improved device for deflecting an electron beam.

Furthermore, according to the invention, a device for the bending or deflection of a beam of monopolar charged particles is suggested in which a region for the beam is provided along with a mounting arrangement for mounting a target object for the beam, as well as a magnetic pole arrangement in the form of pole shoes extending laterally to the region for the beam path between whose faces a magnetic flux density field in at least a part of the region for the beam path is generated for deflection of the beam.

Within the scope of the above stated task and to provide pole shoes which are as small as possible and which do not extend into a region of the target object, an arrangement for the pole shoes is also provided according to the present invention.

A still further object of the present invention is to provide a device for deflecting a beam of monopolar charged particles, as well as a mounting arrangement for a target to be struck by the deflected beam, comprising a pair of pole shoes extending laterally of a region containing the path of the deflected beam, the pole shoes having faces which prod a density field therebetween, the faces being inclined at least in sections toward the mounting arrangement for the target. A further object of the invention is to provide such a device wherein the mounting area for the target is outside the region of the pole shoes.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which the preferred embodiments of the invention are illustrated.

BRIEF DESCRIPTION OF THE DRAWINGS

The invention is described by example in the following and in conjunction with the drawings wherein.

DESCRIPTION OF THE PREFERRED EMBODIMENTS

Figure 3:
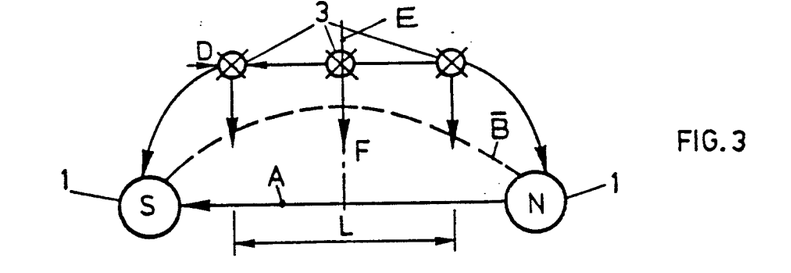
FIG. 3 schematically illustrates an embodiment according to the invention with a linearized deflection field for a monopolar beam.

FIG. 3 schematically shows the process according to the invention in contrast to that shown in FIG. 1 and 2. The known field configuration of a magnetic flux density field $\bar{B}$, drawn here in dashed lines, originates between two magnetic poles 1,1. According to the invention this field is linearized in a region L which is significantly longer than the diameter D of beam 3 viewed in the direction of the pole axis i.e. parallel to the dipole axis A, in that the field components are essentially compensated perpendicularly to the dipole axis A.

In FIG. 3, it is evident that the position of the particle beam 3 can be shifted without force components in the direction of the dipole axis A being, generated on the resulting force F. Additionally the produced deflection force F remains constant independently of the position shift in the stated direction. Since all charges in the cross-sectional area of the beam 3 during a position shift in the direction of the dipole axis A remain subjected to constant forces, no change in the form of the cross section of the beam results by such a shift, although the beam extends above or outside the region between the poles 1.

Figure 4:
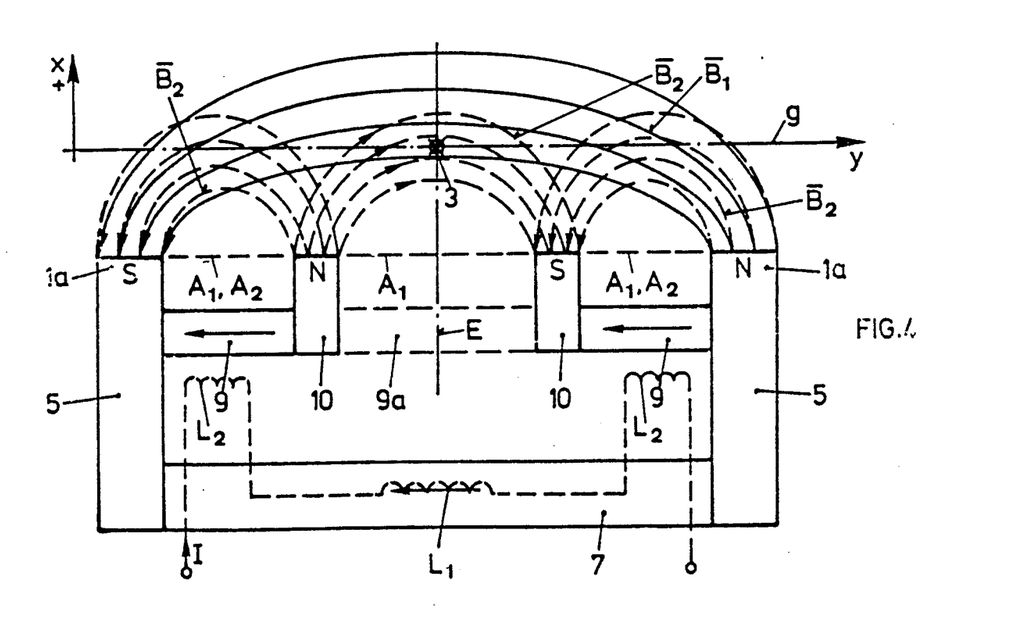
FIG. 4 schematically illustrates a preferred process and device for the generation of a linearized deflection field according to the invention.

FIG. 4 schematically illustrates a preferred embodiment of the field configuration according to FIG. 3 and a device therefore according to the invention.

Between the two magnet poles 1a, 1a, for example formed by pole shoes 5, on both sides of a magnet 7, the flux density field $\bar{B}_1$ with curved lines of force originated. The position of the particle beam 3 is illustrated on a straight line g which is equidistant from poles 1a and consequently parallel to the magnetic axis A1 of magnet 7. Along this straight line g the portion of beam 3 is to be variable according to the explanations in connection with FIG. 3.

In the region of the magnet poles 1a and consequently offset in the same direction from the straight line g as the poles 1a, compensation magnets 9, 9 are provided which have poles 10, 10. The other poles of compensation magnets 9 are formed directly by connection with respective poles 1a. Through the magnets 9 compensation flux density fields $\bar{B}_2$, are formed as shown in dashed lines. There it should be understood that the representation of FIG. 4 is not exact but rather represents the qualitative field configuration. Instead of magnets 9 a magnet 9a could also be provided to form poles 10, 10.

Figure 5A:
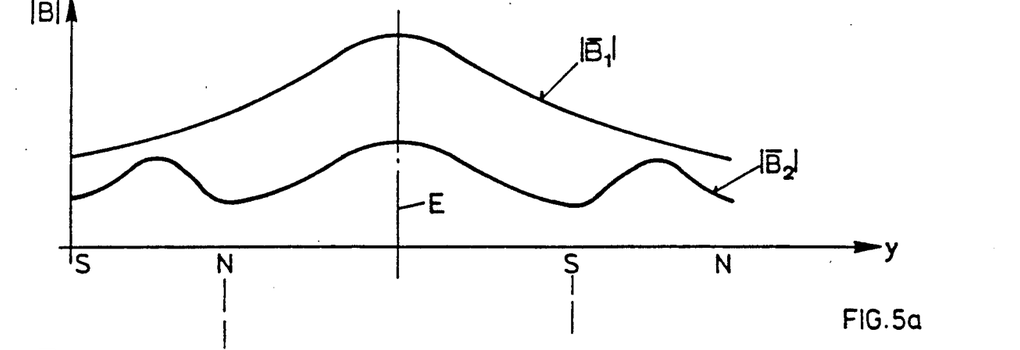
FIG. 5a is a graph plotting field magnitudes occurring along a straight-line displacement path for the beam according to FIG. 4.

In FIG. 5a the magnitude of the field $\bar{B}_1$ generated between the poles 1a as well as the particular magnitudes of the compensation fields $\bar{B}_2$ if one propagates on the straight line g in the direction y indicated in FIG. 4, are shown. Therein it is to be taken into consideration that field lines determine places of identical field strength and that these increase, with decreasing distance from the particular dipole axes $A_1$ between the poles 1a or $A_2$ between the poles of the magnets 9, in the embodiment according to FIG. 4 and partially coincidingly.

Figure 5B:
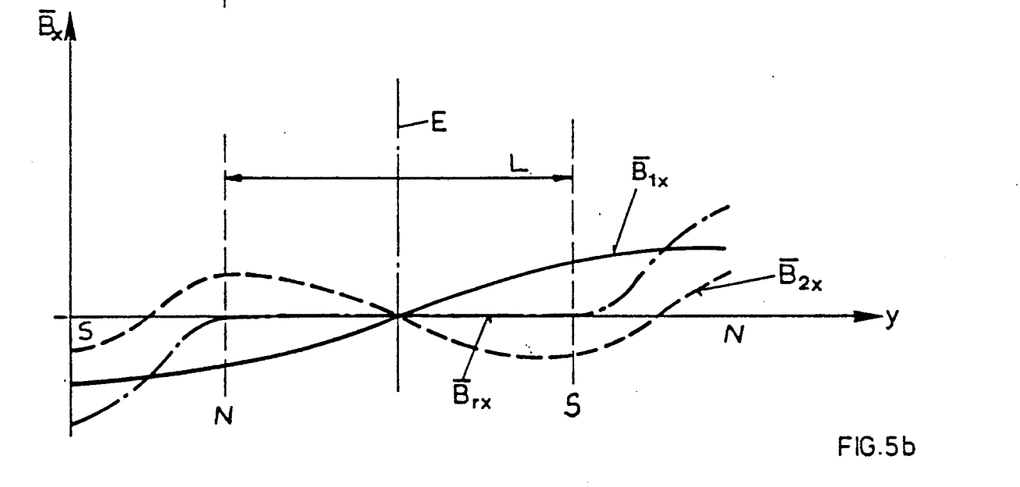
FIG. 5c is a graph similar to FIG. 5a plotting vertical components of the field vectors along with deflection compensation and the resulting fields.
FIG. 5d is a graph similar to FIG. 5a plotting horizontal components of the field vectors along with deflection, compensation and resulting fields.

In FIG. 5b the vertical components in the X-direction according to FIG. 4 are represented for the flux density field encountered on proceeding as described on the straight line g. It is known that for evaluating the resulting fields the vector components of the two field components can be added directly. Consequently as shown in dot-dashed lines in FIG. 5b, in the region L which can be greater or smaller depending on the lay-out but in any event must be significantly greater than the diameter D of the particle beam 3, vanishing X-components $\bar{B}_{rx}$ result.

Figure 5C:
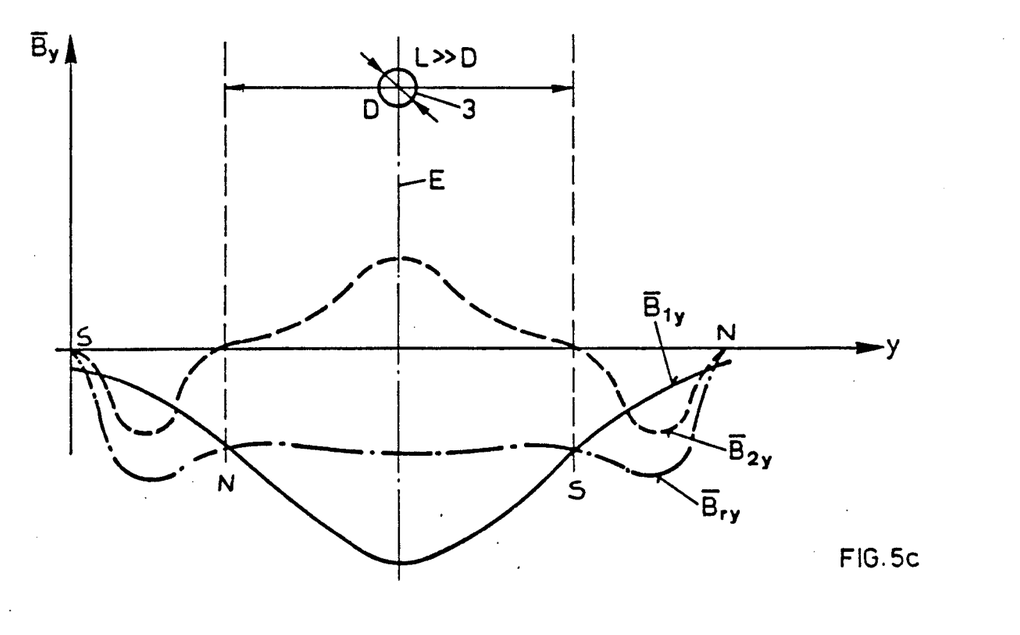

A corresponding representation for the horizontal components in the Y-direction is shown in FIG. 5c. From this it is evident that the horizontal components $\bar{B}_{ry}$ of the resulting flux density field $\bar{B}_r$(not shown) over the section L, are essentially constant.

It is understood that the representations in FIGS. 5 are only qualitative and are only to serve for the purpose of explaining the linearization effect of the compensation fields $\bar{B}_2$ according to FIG. 4.

As is apparent from the considerations in connection with FIGS. 4 and 5 that homogenation of the original deflection flux density field $\bar{B}_1$ is achieved in area L b margin zones near the poles, the curvatures are increased. A middle region with less curvature is thus achieved. The originally inhomogeneous curved field is changed by an harmonic synthesis (reversal of the harmonic analysis or Fourier expansion) of appropriate type, into an approximately rectangular spatial field pattern.

This approach can be applied wherever a spatially homogenous magnetic field is desired.

Figure 6:
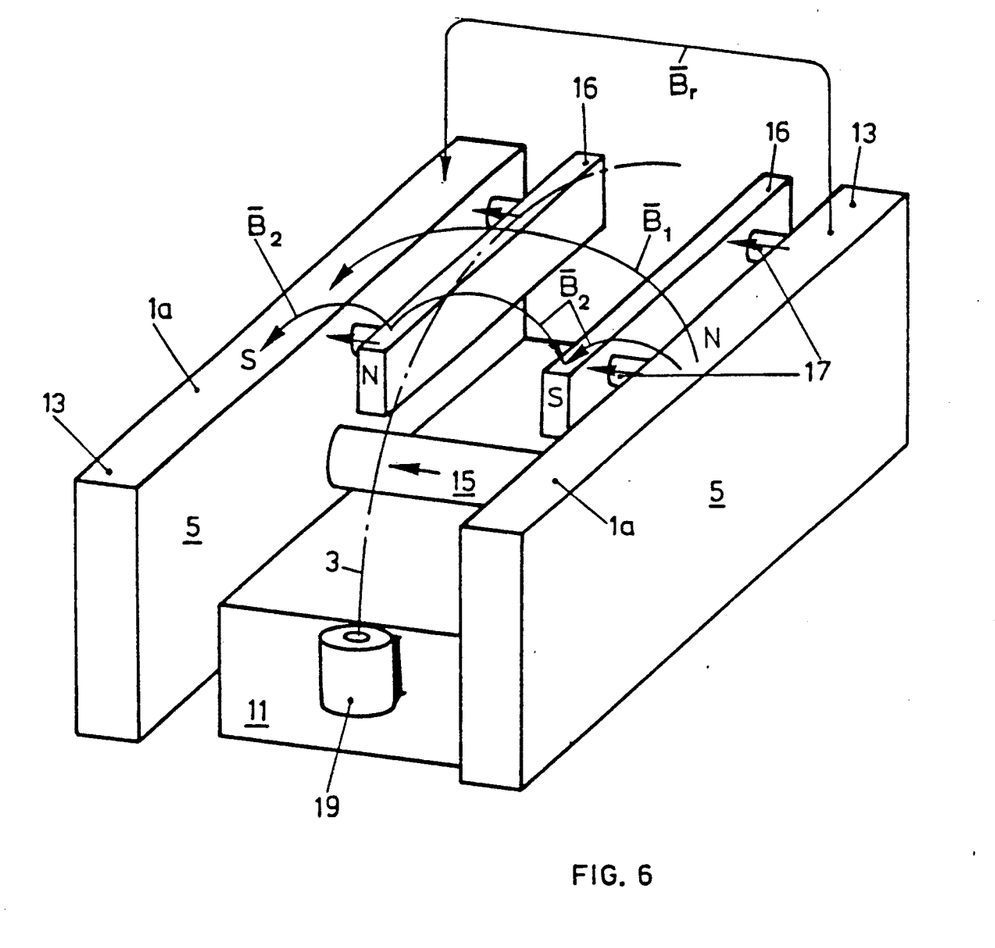
FIG. 6 is a schematic perspective view of a preferred embodiment of the device according to the invention.

FIG. 6 schematically shows a preferred embodiment of the device according to the invention where the same numerals are used to designate the same or similar parts. Between pole shoes 5 which are combined in a U-shape form through a base part 11, magnetic poles 1a are formed with front faces 13 of the shoes. This is done by providing a magnet 15 between the pole shoes 5. Magnet 15 can be an electromagnet, a permanent magnet or a combined arrangement of electro- and permanent magnets. In the region of the front faces 13 corresponding to the magnetic poles 1a, additional pole shoes 16 are provided which are connected via magnets 17 to the pole shoes 5. The magnets 17 also can be permanent magnets, electromagnets or a combination of electro- and permanent magnets.

The fields $\overline{B}_1$ and $\overline{B}_2$, resulting qualitatively from the represented magnet arrangements, are shown. Also shown in dash-dot line is the particle beam 3, in particular an electron beam, generated by a beam generator 19. $\overline{B}_r$ is the rectangular field resulting from fields $\overline{B}_1$ and $\overline{B}_2$.

Figure 7:
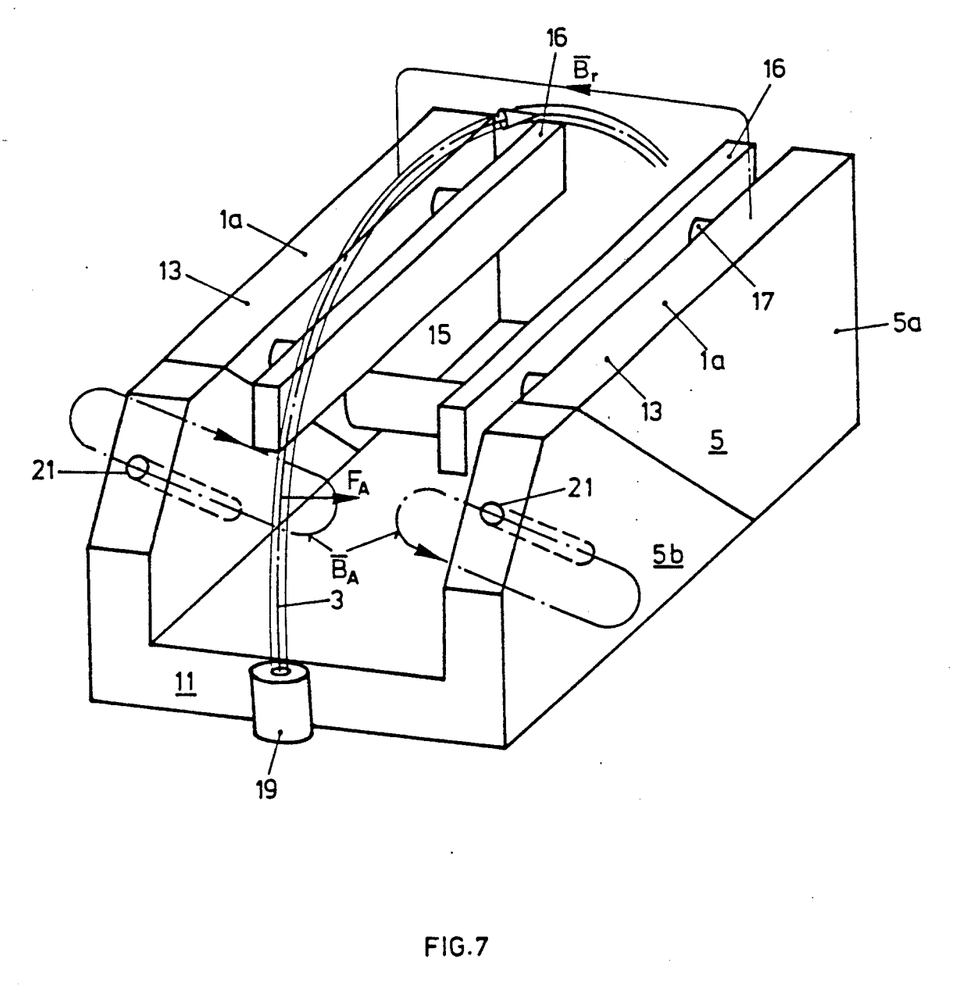
FIG. 7 is a schematic perspective view, analogous to FIG. 6, of a further expanded preferred embodiment of the device according to the invention with the additional possibility for lateral deflection of the beam.

In FIG. 7 a further preferred development of the arrangement according to FIG. 6 is represented such as is used in particular for the control of the electron beam in an electron beam gun for the vaporization of materials in a vapor deposition installation. Corresponding parts have the symbols used in FIG. 6.

In order to be able to shift the beam 3, in particular the electron beam according to the explanations in connection with FIGS. 3, 4, and 5 laterally i.e. according to FIG. 4 in the Y-direction, a lateral deflection flux density field $\overline{B}_A$ is applied provided identically on both sides of the beam 3 and which, on the one hand, is perpendicular to the propagation direction of beam 3 in the effected region, and on the other hand,, also perpendicular to the direction of the longitudinal deflection field $\overline{B}_r$. Through this flux density field $\overline{B}_A$ depending on the field direction the beam is shifted back and forth according to the resulting force $F_A$.

For generating the lateral deflection field $B_A$ magnet arrangements 21 are provided at the shoes 5b which again can be permanent magnets, electromagnets or a combination thereof. While the sections 5a of shoes 5 forming the poles 1a can be fabricated of iron, thus of a ferromagnetic material, the magnets 21 in sections 5b of the shoes 5 are held in a magnetically largely insulating material such as Inox.

Figure 8:
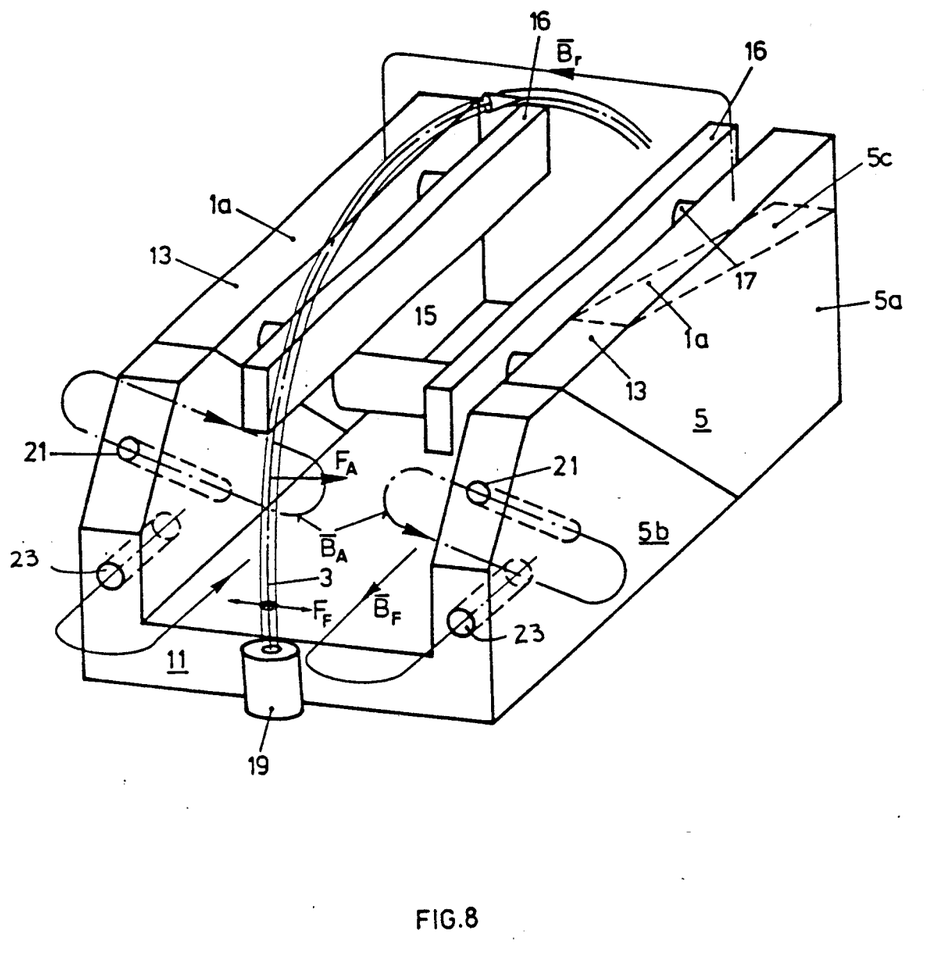
FIG. 8 is a view similar to and building on the representation according to FIG. 7 of a further development of the device according to the invention with focussing control.

Building on the representation according to FIG. 7 a further preferably provided structure is shown in FIG. 8. In the shoe regions 5b a further pair of magnets 23 is provided which now, in contrast to the deflection magnets 21 generates a flux density field $\overline{B}_F$ which has inverse polarity on both sides of beam 3. With the aid of this field $\overline{B}_F$ the beam cross sectional area Q is influenced, as represented by $F_F$, with always oppositely directed forces resulting which expand or compress the beam cross-sectional area perpendicular to the field. This is in contrast, as mentioned, to the deflection field of the magnets 23 which always effect a resulting force in one direction onto the particles in the beam. The magnets 23 are also permanent magnets, electromagnets or, and preferably, a combination of these magnet types.

The structure of the entire arrangement under consideration, to satisfy cooling and other requirements, is constructed preferably of copper, Inox, and pure iron. In particular the magnets, or at least parts thereof are held in magnetically poorly conducting material such as Inox so that magnetic shunts are prevented which would lower the field components to be utilized for the effect on the beam.

The magnets or parts thereof are also held in electrically poorly conducting material, also a property of Inox. The generation of mutual inductances due to eddy currents is, in this way, largely prevented. The time constants for switching variation of the flux density fields become surprisingly small in spite of the extremely compact construction with which variations of the field with limit frequencies up to a few kHz are possible. The invention can readily operate at a power of approximately 10 kW for the electron beam on a vaporization surface wobbling with 1 kHz with respect to position and focus.

FIG. 4 furthermore shows, in dashed lines, how, if necessary the compensation fields $\overline{B}_2$ can be controlled as a function of the deflection field $\overline{B}_1$. Windings $L_2$ for electromagnetic generation or joint generation of fields $\overline{B}_2$ are connected in series with, for example, a winding $L_2$ for the generation or joint generation of field $B_1$. The excitation currents are corrected in mutual dependence, as now obvious to the man skilled in the art.

Figure 9A:
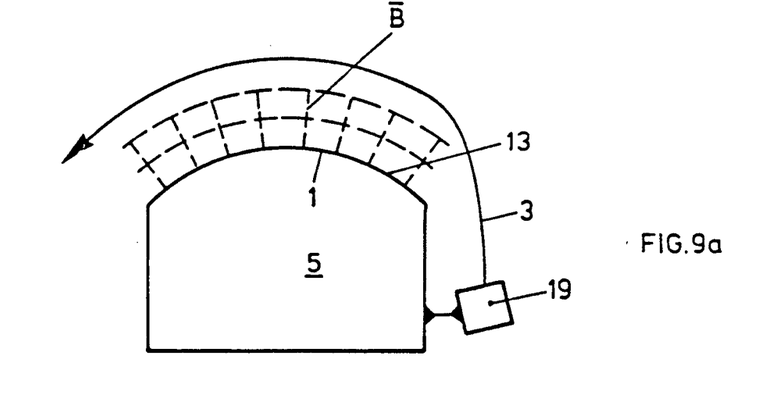
FIG. 9a is a schematic side view of a device according to the invention with a specifically formed pole area for the longitudinal deflection field.
Figure 9B:
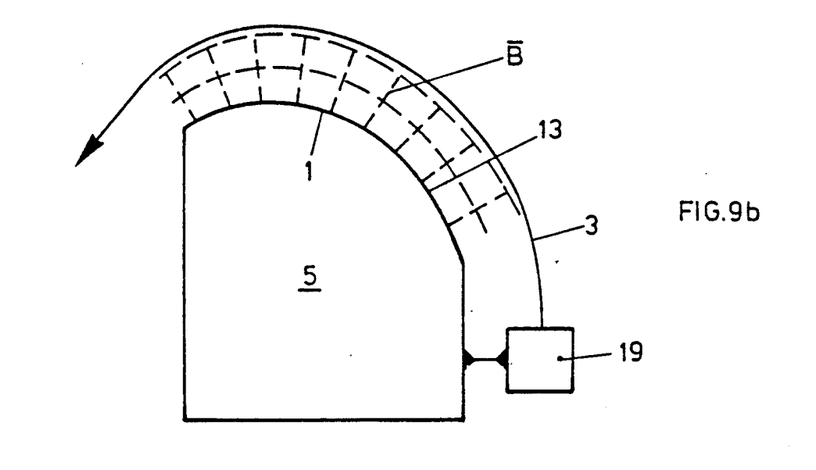
FIG. 9b is a view similar to FIG. 9a with a differently formed pole area for the deflection field.
Figure 9C:
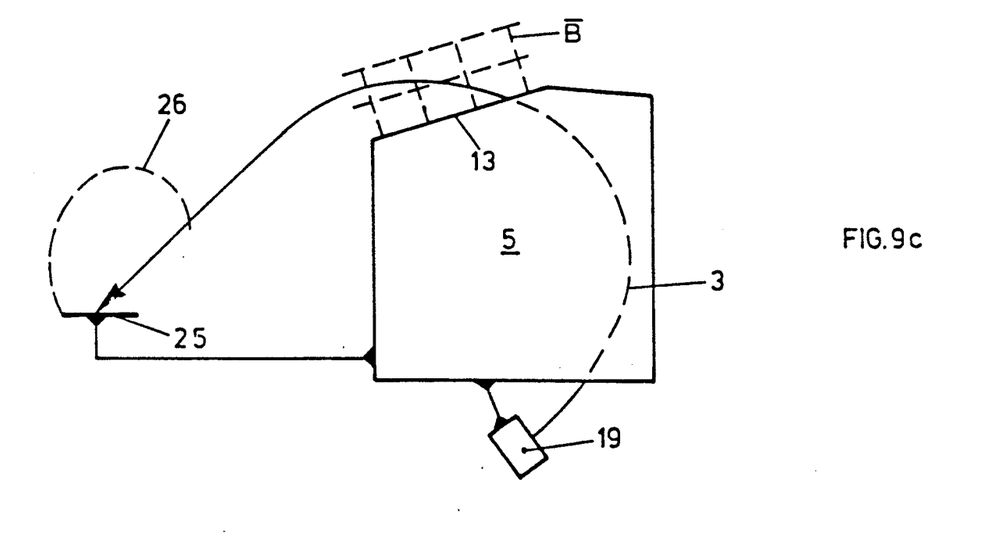
FIG. 9c is a view similar to FIG. 9a with a still differently formed pole area for the deflection field.

In conjunction with FIGS. 9a to 9c a further aspect of the present invention will be described. FIGS. 9a to 9c show schematic side views of devices according to the invention.

According to FIGS. 9a and 9b the pole shoes 5 are intentionally bent at their front faces 1 forming the poles in order to provide a desired given path for the beam generated by the beam generator 19. B represents the longitudinal deflection field in dashed lines, the lines indicating areas of identical potential.

When using the device according to the invention as a control unit on an electron gun with the electron beam used to vaporize a target object for example in a coating installation, the arrangement represented schematically in FIG. 9c is used. At the beginning i.e. after leaving the beam generator 19, the beam 3 is initially guided between the shoes 5 in a deflection flux density field which is largely homogeneous in this area.

The beam 3 subsequently leaves the region of the shoes and propagates above the front faces 13 where also preferably the linearization measures are carried out such as were explained in conjunction with FIG. 4 and 5. Since the surfaces 13 are inclined relative to a target object 25, which is drawn schematically, and which, with respect to the shoes 5, is fixedly positioned, the beam path is additionally curved so that after leaving the area of influence of the deflection field, the beam impinges, in an inclined and elongated manner, onto the remote target area 25. In this way it becomes possible for the target object 25 to be positioned at a location removed from the shoes 5, which, on the one hand, permits a reduction of the shoe extension and, on the other hand, ensures that the, beam extends over a large area outside the shoes 5 which latter hardly become coated anymore since they are removed from the influence of the vaporization 26 around the target.

The form of shoe 5 at 5c shown in dashed lines in FIG. 8 corresponds to the bevelling shown schematically in FIG. 9c of the front faces 13 forming the poles.

With the suggested process according to the invention for field homogenation, field regions outside the homogeneous field area between the magnetic poles are utilizable for beam guidance. With the invention, however, the field configuration can also be influenced in a simple manner through the form of the pole shoe front faces. The constructional flexibility of the device is increased drastically. Since the target area can be remote outside of the shoes, large lateral shifts for the beam adjustment become possible. In FIG. 9c for example, already a small lateral shift of the beam between the shoes results in a significantly greater shift of the beam on the target object.

With the arrangement such as represented schematically in FIG. 8 a highly compact control unit in particular for an electron beam of an electron gun is realized in which essentially independently of each other, the beam focussing, the lateral beam deflection, and longitudinal the beam deflection can be controlled.

The poles 10, 10 for the additional magnetic field as shown in FIG. 4, are advantageously much closer together, approximately one half as close together, as the poles la, la of the diverting magnet. The secondary magnets may also be connected in series when formed as electromagnets. The focussing means shown in FIGS. 7 and 8 may also be known Wehnelt electrode units.

While specific embodiments of the invention have been shown and described in detail to illustrate the application of the principles of the invention, it will be understood that the invention may be embodied otherwise without departing from such principles.

What is claimed is:

1. A method for the deflection of a beam of monopolar charged particles, comprising:

generating a first magnetic deflection flux density field extending in a first direction perpendicular to a local propagation direction of the beam in order to deflect the beam in a second direction perpendicular to the first direction and to the beam propagation direction, the first magnetic flux density field having curved lines of force extending between two poles of a magnetic dipole for generating the first field, which lines are offset from a dipole axis of the magnetic dipole;

guiding the beam essentially in a path region through the curved lines of force of the first magnetic field; and generating at least one additional flux density field in harmonic synthesis with the first magnetic field for essentially linearizing the lines of a resulting field in the path region.

2. A method as stated in claim 1, wherein, with the curved lines of force viewed in the propagation direction, the additional field is superimposed as a compensation flux density field so that a center of curvature of lines of force of the compensation field is lateral to the path region, so that the curvature of the compensation field lines of force has the same direction as the curvature of the lines of force of the first field and is greater than the curvature of the first field lines, and so that the polarity of field vectors of the fields is selected so that they act along the lines of force substantially in the same direction.

3. A method as stated in claim 1, including controllably deflecting the beam in the first direction also.

4. A method as stated in claim 3, wherein the beam is deflected in said first direction by means of a controllable deflection magnetic flux density field which extends essentially in the second direction.

5. A method as stated in claim 3, wherein the beam is controllably varied with respect to its cross-sectional area, in a manner which is substantially decoupled from said deflection of the beam in said first direction.

6. A method as stated in claims 1, wherein the beam is controllably varied with respect to its cross-sectional area, in a manner which is substantially decoupled from the deflection of the beam in said second direction.

7. A method as stated in claim 1, wherein the beam is controllably varied with respect to its cross-sectional area by means of a focussing flux density field applied with opposite polarity on both sides of the beam.

8. A device for deflecting a beam of monopolar charged particles in which a region is provided for a beam path, comprising:

first magnetic deflection pole means for generating a first pole-to-pole curved deflection flux density field extending in the region for the beam path in a direction essentially perpendicular to a propagation direction of the beam; and second field generation means for generating a second field which acts in harmonic synthesis with the first magnetic field for substantially linearizing a resulting field in the path region, wherein field being generated between poles of the first magnetic deflection pole means in order to compensate for curvature of the first field.

9. A device as stated in claim 8, wherein, with respect to the region for the beam path and substantially symmetrically thereto and offset laterally with respect to the region for the beam path towards the first deflection pole means, the second field generation means comprises at least one pair of magnetic compensation poles whose gap between poles is shorter than a gap between poles of the first deflection pole means, the second field having vectors which are directed substantially in the same direction as vectors of the first deflection field, and lines of force of the second field being curved in the same direction as line of force of the first deflection flux density field.

10. A device as stated in claim 9, wherein the poles are poles of permanent or electromagnetic arrangements.

11. A device as stated in claim 10, wherein the poles comprise electromagnetic poles and the electromagnetic poles are powered in mutual dependence.

12. A device as stated in claim 8, wherein the poles for the first deflection means are formed by front faces of a pair of pole shoes disposed in the shape of a U and the region for the beam path is substantially symmetrical thereto and, along a deflection section of the beam path, lies outside said U.

13. A device as stated of claims 8, including deflection control means for controllably varying a position of the beam in the direction of the first deflection field.

14. A device as stated in claim 13, wherein the deflection control means comprises at least one magnetic dipole arrangement on each side of the region for the beam path whose axis is substantially perpendicularly to the direction of the first deflection field.

15. A device as stated in claim 14, wherein the first deflection pole mean is positioned substantially parallel to planes of the magnetic dipole and constructed unitarily therewith.

16. A device as stated in claim 15, wherein the magnetic dipole comprises electro or permanent magnets.

17. A device as stated in claim 8, including focussing control means for focussing the beam.

18. A device as stated in claim 17, wherein the focussing control means is on both sides of the region for the beam path and comprises one magnetic focussing dipole arrangement on each side of the beam path whose axes is substantially perpendicular to the direction of the first deflection field.

19. A device as stated in claim 18, wherein the focussing means comprise permanent or electromagnets.

20. A device as stated in claims 8, wherein at least one portion of the first pole means is held in magnetically poorly conducting material.

* * * * *